United States Patent
Björklund

(10) Patent No.: US 8,598,887 B2
(45) Date of Patent: Dec. 3, 2013

(54) FAULT WAVE ARRIVAL DETERMINATION

(75) Inventor: Hans Björklund, Ludvika (SE)

(73) Assignee: ABB Technology AG, Zurich (CH)

(*) Notice: Subject to any disclaimer, the term of this patent is extended or adjusted under 35 U.S.C. 154(b) by 0 days.

(21) Appl. No.: 13/637,947

(22) PCT Filed: Apr. 13, 2010

(86) PCT No.: PCT/EP2010/054841
§ 371 (c)(1),
(2), (4) Date: Oct. 1, 2012

(87) PCT Pub. No.: WO2011/127967
PCT Pub. Date: Oct. 20, 2011

(65) Prior Publication Data
US 2013/0021039 A1    Jan. 24, 2013

(51) Int. Cl.
*G01R 31/08* (2006.01)

(52) U.S. Cl.
USPC .............................................. 324/535

(58) Field of Classification Search
USPC .............. 324/522, 535, 762.01–762.1, 324/750.1–750.3; 257/48; 438/14–18
See application file for complete search history.

(56) References Cited

U.S. PATENT DOCUMENTS

| | | | |
|---|---|---|---|
| 4,187,461 A | 2/1980 | Cox | |
| 4,451,786 A | 5/1984 | Sawada et al. | |
| 5,903,155 A | 5/1999 | Björklund | |
| 6,822,457 B2 | 11/2004 | Borchert et al. | |
| 7,973,536 B2* | 7/2011 | Kojovic et al. | 324/512 |
| 8,183,871 B2* | 5/2012 | Saha et al. | 324/522 |
| 2004/0230387 A1 | 11/2004 | Bechhoefer | |

FOREIGN PATENT DOCUMENTS

| | | |
|---|---|---|
| CN | 1376930 A | 10/2002 |
| DE | 3921594 A1 | 1/1991 |
| DE | 4142471 A1 | 7/1992 |
| EP | 0649029 A2 | 4/1995 |
| EP | 1001271 A1 | 5/2000 |
| EP | 1016869 A2 | 7/2000 |

OTHER PUBLICATIONS

Da Silva et al., "A Fault Locator for Three-Terminal Lines Based on Wavelet Transform Applied to Synchronized Current and Voltage Signals", 2006 IEEE PES Transmission and Distribution Conference and Exposition Latin America, 2006, Venezuela.
Feng et al., "A New Fault Location Method Avoiding Wave Speed and Based on Traveling Waves for EHV Transmission Line", Electric Utility Deregulation and Restructuring and Power Technologies, DRPT2008, Apr. 6-9, 2008, Nanjing, China.

* cited by examiner

*Primary Examiner* — Tung X Nguyen
(74) *Attorney, Agent, or Firm* — Birch, Stewart, Kolasch & Birch, LLP

(57) ABSTRACT

A method and apparatus for determining the time of arrival of a fault wave at a measurement point of a power transmission system includes a measurement unit measuring a power quantity of the system at the measurement point (P1) for obtaining a measurement quantity being a potential fault wave, a time keeping unit, a storage unit storing the measurement quantity, a comparing unit comparing the measurement quantity with a threshold (T1) for detecting the presence of a fault wave (W1) and an analyzing unit. The analyzing unit analyzes measurements made before the fault wave presence was detected, determines the starting point (SP) of the fault wave based on the analysis and sets the time of the starting point to be the fault wave arrival time (T1).

20 Claims, 3 Drawing Sheets

FAULT WAVE ARRIVAL DETERMINATION

FIELD OF THE INVENTION

The present invention generally relates to power transmission systems. More particularly the present invention relates to a method and an apparatus for determining the time of arrival of a fault wave at a measurement point of a power transmission system.

BACKGROUND

In power transmission systems, faults like ground faults may occur. It is important to locate where such a fault occurs for instance in order to quickly remove it.

For long power lines, like overhead lines and cables, it is desirable to detect the location of a ground fault directly after the fault occurs in order to be able to dispatch repair crews to the correct position of the line or cable. Such power lines can be very long, for instance in range of 700-2500 km for overhead lines or in the range of 100-1000 km for submarine cables. Also combinations of overhead lines and cables are possible.

It is possible to determine the distance to a fault through analyzing a wave caused by the fault that reaches a measurement point. This is for instance described in the article "A Fault Locator for Three-Terminal Lines Based on Wavelet Transform Applied to Synchronized Current and Voltage Signals" by da Silva et al, 2006, IEEE PES Transmission and Distribution Conference and Exposition Latin America, Venezuela. The article describes the use of current detail signals of a wavelet transform for comparison with a self-adjustable threshold level. The current detail signals are harmonics of a basic Alternating Current (AC) signal. This type of distance to fault determination functions well in relation to AC power lines, but is less suitable for Direct Current (DC) power lines.

There is another way in which a wave can be analyzed and this is through using measurements at two different locations. The distances to a fault are here determined through measuring the instance in time a wave caused by a fault reaches two different locations and to determine the distance to the fault based on the time differences.

This principle is for instance described in U.S. Pat. No. 5,903,155, U.S. Pat. No. 6,822,457, EP 1,001,271 as well as in the article "A New Fault Location Method Avoiding Wave Speed and Based on Traveling Waves for EHV Transmission Line", by Zhang Feng et al, 2008, THIRD INTERNATIONAL CONFERENCE ON ELECTRIC UTILITY DEREGULATION AND RESTRUCTURING AND POWER TECHNOLOGIES, VOL 1-6, APR. 6-9, 2008, 3rd International Conference on Electric Utility Deregulation, Restructuring and Power Technologies.

These types of fault distance measurements do function also for DC lines and are therefore good to use also in these situations.

In the above mentioned article by Zhang Feng et al the determination of the distance to a fault is also described as being based on detecting the moment when an initial wave surge arrives at a measurement point. This point in time is thus important.

There is one problem with this approach though and that is that the amplitude and shape of the fault wave that arrives at a measurement point can vary considerably based on where the fault occurs in relation to this measurement point. This has a negative influence on the accuracy of the measurement of the arrival time. It is therefore in some situations hard to determine the point in time that such a fault wave actually reaches a measurement point. Furthermore, as the distance to a fault is determined through a difference between two such arrival times, it is sufficient that one of the measurements is not precise enough in order to degrade the accuracy of the determination of the distance.

Also other factors influence the determination of the time a fault wave reaches a measurement point, such as varying operating conditions and varying noise levels.

There is therefore a need for providing a more precise determination of the time a fault wave reaches a measurement point of a power transmission system.

SUMMARY OF THE INVENTION

The present invention addresses this situation. The invention is thus directed towards solving the problem of providing a more precise determination of the time of arrival of a fault wave at a measurement point, which time of arrival can be used in security related applications of a DC power transmission system.

This problem is according to one aspect of the invention solved through a method for determining the time of arrival of a fault wave at a measurement point of a power transmission system comprising the steps of measuring a power quantity of the system at the measurement point in order to obtain a measurement quantity that is a potential fault wave, storing the measurement quantity in a storage unit, detecting the presence of a fault wave at the measurement point through comparing the measurement quantity with a threshold, analyzing measurements of the measurement quantity made before the presence of the fault wave was detected, determining the starting point of the fault wave based on the analysis and setting the time of the starting point to be the time of arrival of the fault wave.

This problem is according to another aspect of the invention solved through an apparatus for determining the time of arrival of a fault wave at a measurement point of a power transmission system, comprising a measurement unit coupled to the measurement point and configured to measure a power quantity of the system in order to obtain a measurement quantity that is a potential fault wave, a time keeping unit, a storage unit configured to store the measurement quantity, a comparing unit configured to compare the measurement quantity with a threshold for detecting the presence of a fault wave at the measurement point, and an analyzing unit configured to analyze measurements of the measurement quantity made before the presence of the fault wave was detected, determine the starting point of the fault wave based on the analysis and set the time of the starting point to be the time of arrival of the fault wave.

The invention has a number of advantages. It provides an improved accuracy as the time of an incoming fault wave can be accurately determined, which is of advantage if a fault occurs close to an end of a long power line. The invention also avoids the need for the special type of satellite synchronized clocks that can time stamp external events internally. Instead more general purpose satellite synchronized clocks can be used and these do not have to be dedicated to the fault wave arrival time determination.

BRIEF DESCRIPTION OF THE DRAWINGS

The present invention will in the following be described with reference being made to the accompanying drawings, where FIG. 1 schematically shows a power transmission system comprising two substations, where each substation is provided with an apparatus for determining the time of arrival of a fault wave according to the present invention, FIG. 2 schematically shows an apparatus according to a first embodiment of the invention being connected to a power line, FIG. 3 schematically shows an apparatus according to a second embodiment of the invention being coupled to a power line via measurement equipment.

DETAILED DESCRIPTION OF THE INVENTION

In the following, embodiments of the invention providing the above described functionality will be described.

The present invention is directed towards providing an apparatus in a power transmission system, i.e. in a system for the transmission of electrical power. This system can for instance be a High Voltage Direct Current system (HVDC) or some types of Flexible Alternating Current Transmission System (FACTS) such as Series Capacitors or controlled series capacitors.

Figure 1:
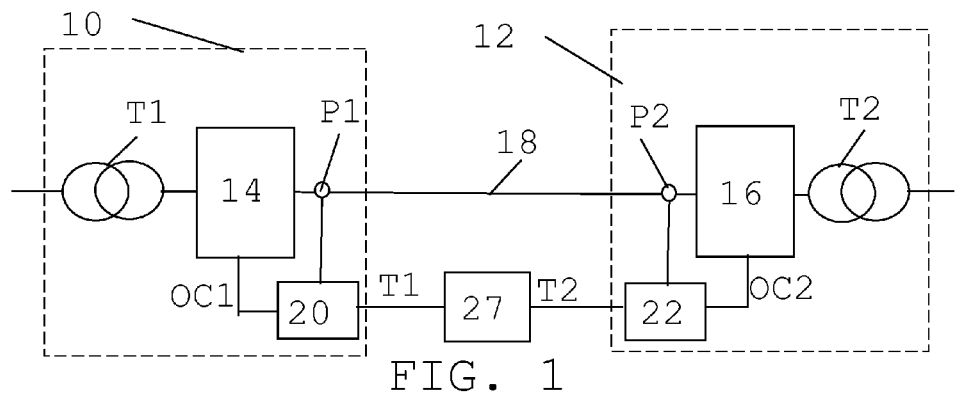

In FIG. 1 there is schematically shown an HVDC system for connection between two Alternating Current (AC) power transmission systems. For this reason the HVDC system includes a first and a second substation 10 and 12, where the first substation 10 includes a first transformer T1 and a first set of converters 14 for conversion between AC and DC, which first set of converters 14 may provide a rectifier. The first transformer T1 connects the first set of converters 14 to the first AC power transmission system (not shown). The first set of converters 14 is connected to a second set of converters 16 of a second substation 12 via a DC power line 18. The second set of converters 16 also converts between AC and DC and may provide an inverter. The second substation 12 also includes a second transformer T2, which connects the second set of converters 16 to the second AC power transmission system (not shown).

The HVDC system in FIG. 1 is a monopole system. It should however be realized that the invention may also be provided in a bipole system. The HVDC system can furthermore be more complex and include several more power lines and substations. The invention is in fact not limited to HVDC systems but may also be provided in relation to an AC system.

Both the sets of converters 14 and 16 may include any type of converters, such as line-commutated Current Source Converters (CSC) or forced commutated Voltage Source Converters (VSC). The converters of each set may include a number of series connected converters. Each set may furthermore include only one converter. In some instances they do both include more than one converter.

Each substation 10 and 12 furthermore includes an apparatus for determining the time of arrival of a fault wave. There is a first such apparatus 20 in the first substation 10 being connected to a first measurement point P1 of the power line 18 and a second apparatus 22 in the second substation 12 being connected to a second measurement point of the power line 18. The first apparatus 20 is furthermore connected to the first set of converters 14 in order to receive first operating condition data OC1, and the second apparatus 22 is connected to the second set of converters 16 in order to receive second operating condition data OC2. Both the apparatuses 20 and 22 are furthermore connected to a fault distance determining unit 27. In the figure there is shown how the first apparatus 20 sends a first time value T1 to the fault distance determining unit 27, while the second apparatus 22 sends a second time value T2 to the fault distance determining unit 27.

Figure 2:
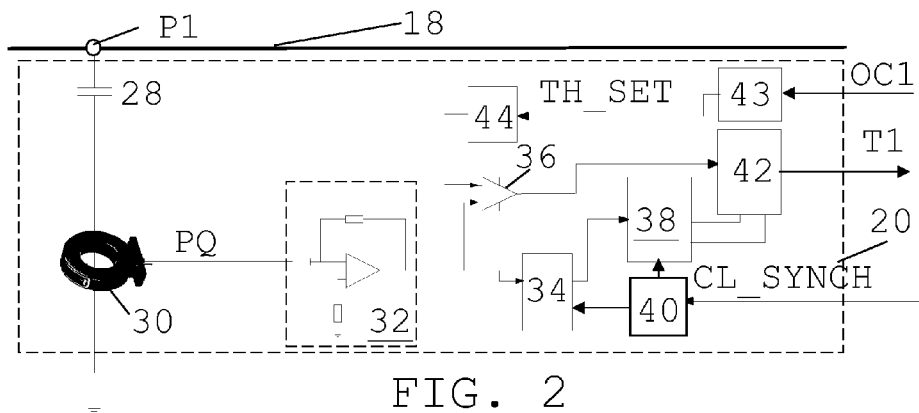

FIG. 2 shows a block schematic of a first embodiment of the first apparatus 20 being connected to the power line 18 at the first measurement point P1.

The first apparatus 20 includes a power quantity scaling unit, which in this embodiment includes a coupling capacitor 28 in series with a Rogowski coil 30. These are connected in series between the first measurement point P1 and ground. It should here be realized that these two elements are exemplifying power quantity scaling elements of the power quantity scaling unit in order to scale the power quantities being measured at the first measurement point P1 to levels that can be handled. These are furthermore mere examples of such elements. The capacitor could for instance be replaced by a Power Line Carrier (PLC) filter and the Rogowski coil with a pulse transformer. This Rogowski coil 30 is connected to the input of a measurement unit 32, which measurement unit 32 in this embodiment is realized as an operational amplifier having a negative feedback connection. The measurement unit is thus coupled to the first measurement point P1 via the capacitor 28 and Rogowski coil 30. The output of the measurement unit 32 is connected to an A/D-converter 34, which in turn is connected to a storage unit 38, which in some variations of the invention is a temporary storage unit that can be provided as a ring buffer. The storage unit 38 is connected to a time keeping unit 40 in the form of a local clock as well as to an analyzing unit 42. The local clock 40 is also connected to the A/D converter 34. There is furthermore a threshold setting unit 43 being connected to a D/A converter 44, which D/A converter 44 is connected to a first input of a comparing unit 36, here in the form of a comparator. The comparing unit 36 has a second input connected to the output of the measurement unit 32 and an output connected to the analyzing unit 42. The threshold setting unit 43 here receives said first operating condition data OC1 from the first set of converters and controls the setting of a comparing unit threshold with a threshold setting signal TH_SET. The analyzing unit 42 in turn supplies the first time value T1 to the fault distance determining unit.

The local time keeping unit 40 receives clock synchronization signals CL_SYNCH via a process bus such as EtherCAT (which contains mechanisms to synchronize local clocks) or IEC 61850 in combination with Precision Time Protocol (PTP) according to IEEE 1588. In this way the local clock 40 is indirectly synchronized to GPS or another global or regional time source such as DCF77, GLONASS or Galileo.

The A/D converter 34 is with advantage a fast A/D converter and the sampling instances of this are synchronized from the local clock 40. Typical A/D conversion rates can be 20-100 Msamples/s meaning one sample each 10-50 ns.

The analyzing unit 42 is a calculation unit and may be a μController, a Digital Signal Processor (DSP) or a Field-Programmable Gate Array (FPGA). Also the threshold setting unit 43 may be provided as one of these types of elements. The temporary storage unit 38 can be any type of suitable memory where measurement samples are stored together with the sampling time instances. The storage unit 38 should therefore have consecutive shiftable storage positions (or be arranged as a ring-buffer) and be sufficiently long to store about 2-10 ms of continuous signals.

The second apparatus could be provided in the same way as the first apparatus.

Figure 3:
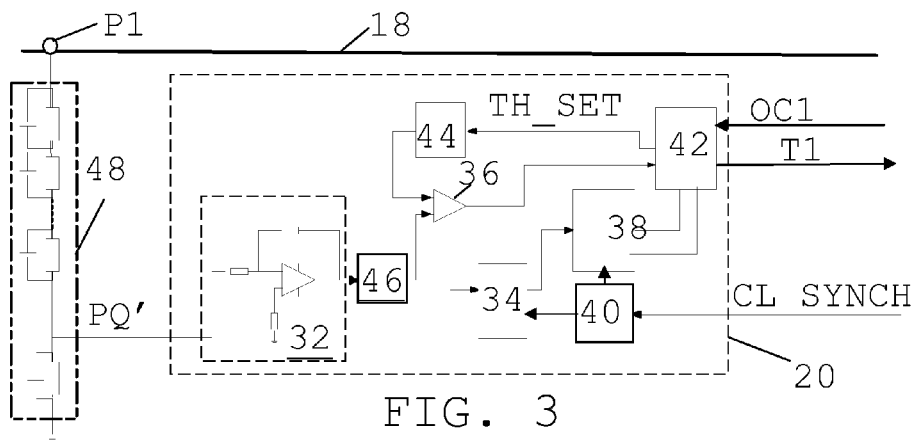

The power quantity scaling elements of the power quantity scaling unit in the first embodiment of the invention are suitable to use if they already exist in a substation for other reasons. However, these elements are not always provided. A second embodiment of the invention is directed towards this case. FIG. 3 schematically shows an apparatus according to the second embodiment of the invention. Here there is a power quantity scaling unit 48 connected between the power line 18 and ground, which power quantity scaling unit 48 includes a number of series connected resistors, each in parallel with a corresponding capacitance. In this second embodiment this power quantity scaling unit 48 is not a part of the apparatus 20. The first apparatus is therefore in this embodiment coupled to, and here indirectly connected to, the power line 18 via the power quantity scaling unit. In this second embodiment there is furthermore a deriving unit 46 provided between the measurement unit 32 and the A/D converter 34 for deriving or providing a derivative of a measured quantity PQ'. In this second embodiment the threshold level determining unit is furthermore combined with the analyzing unit. They may thus be provided in the same circuit. In all other respects the second embodiment is the same as the first embodiment.

The present invention is directed towards allowing precise determinations of a distance to a fault to be made in the system of FIG. 1. This is based on a precise determination of the time at which a fault wave is received at a measurement point of the power transmission system.

A distance to a fault is typically determined based on the time a fault wave, caused by a fault occurring somewhere on a power line, reaches a measurement point. The distance to the fault is then typically determined through the difference between the time of arrival at two points and the speed of such a wave through the power line. The speed is typically slightly lower than the speed of light and also dependent on the material and geometrical design properties of the power line. This speed is thus possible to determine based on the material properties and geometrical design, but also based on measurements and simulations. The speed can thus be considered to be known.

However there is a problem in that the actual time of arrival of such a fault wave can be hard to determine with a good enough precision. What is of interest to obtain is the time of arrival of the beginning or starting point of the fault wave at a measurement point. An imprecise time of arrival in turn leads to the distance to a fault being hard to determine with accuracy, because the accuracy of the distance determinations is determined by the least accurate time value. This can be very problematic, especially if the distance between two measurement points is long. This is quite often the case in DC applications, such as HVDC.

The instance in time when the beginning or starting point of a fault wave reaches a measurement point is preferred to use, since this part of the fault wave has travelled in a direct path from the fault to the measurement point. Other parts of such a fault wave will include contributions from reflections and can therefore be harder to use.

Figure 4:
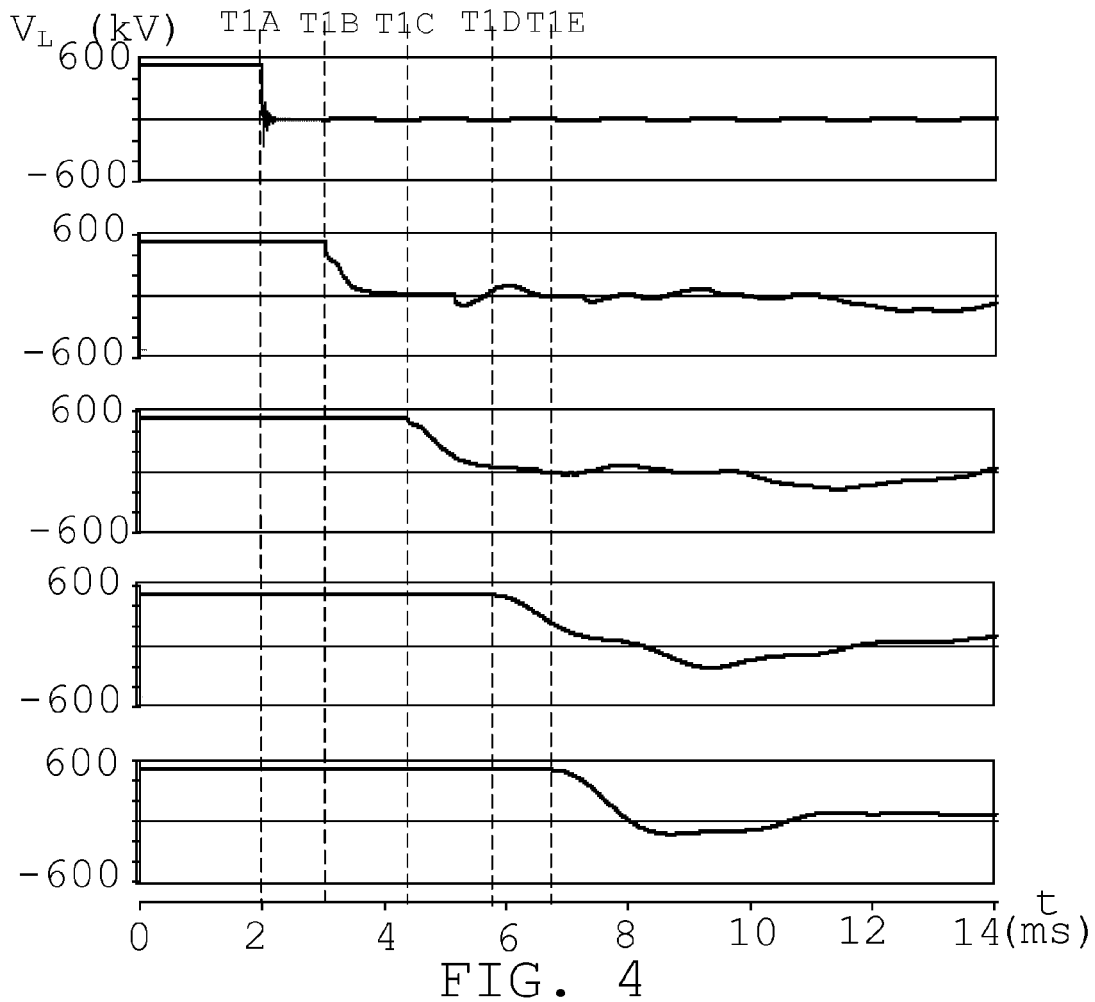
FIG. 4 shows the power quantity of voltage of the power line in the system for a fault being simulated at various distances from a measurement point, FIG. 5 schematically shows a fault wave of a power line, and FIG. 6 schematically shows a number of method steps being performed in an apparatus according to the present invention.

This situation will be exemplified by simulations of a power quantity in the form of voltage of the power line in the system in FIG. 1. These simulations are shown in FIG. 4, where a line having an exemplifying DC voltage level $V_L$ of +533 kV is subject to a ground fault at various distances from a measurement point for a fault occurring at the same point in time. A first curve at the top of FIG. 4 shows a first case where a fault wave caused by a fault occurring close to the first measurement point reaches this measurement point at a point in time T1A being close to 2 ms. The second curve from the top shows a second case where a fault wave caused by a fault occurring at a further point away on the line, for instance about a quarter of the line length towards the second measurement point, reaches the first measurement point at a point in time T1B being close to 3 ms. The third curve from the top shows a third case where a fault wave caused by a fault occurring about half way between the two measurement points reaches the first measurement point at a point in time T1C that is slightly higher than 4 ms. The fourth curve from the top shows a fourth case where a fault wave caused by a fault occurring roughly at three quarters of the length to the second measurement point reaches the first measurement point at a point in time T1D at slightly below 6 ms. Finally the fifth and last curve at the bottom shows a fifth case where a fault wave caused by a fault occurring close to the second measurement point reaches the first measurement point at a point in time T1E being just below 7 ms.

What can be seen here is that at the point in time T1A when the fault wave is received in the first case, the first curve has a first part that falls straight and quickly (the voltage has a high rate of change) in the direction towards zero voltage followed by a second more insignificantly changing part with a lower rate of change. This second part furthermore has clear oscillating components that are damped out. The other curves also have a first and a second part. However, it can clearly be seen that the first straight part of the curves is getting increasingly smaller with the distance from the first measurement point, while the second parts are getting increasingly larger. It is this first part of each curve that has to be found for determining the time of arrival of a fault wave.

As can be seen in FIG. 4, this first part is fairly easy to detect when the fault occurs close to the measurement point, but is considerably harder to discern when the fault is far away, which leads to the point in time being inaccurately determined. This inaccuracy will in turn also be reflected in the determination of the distance to the fault.

Figure 5:
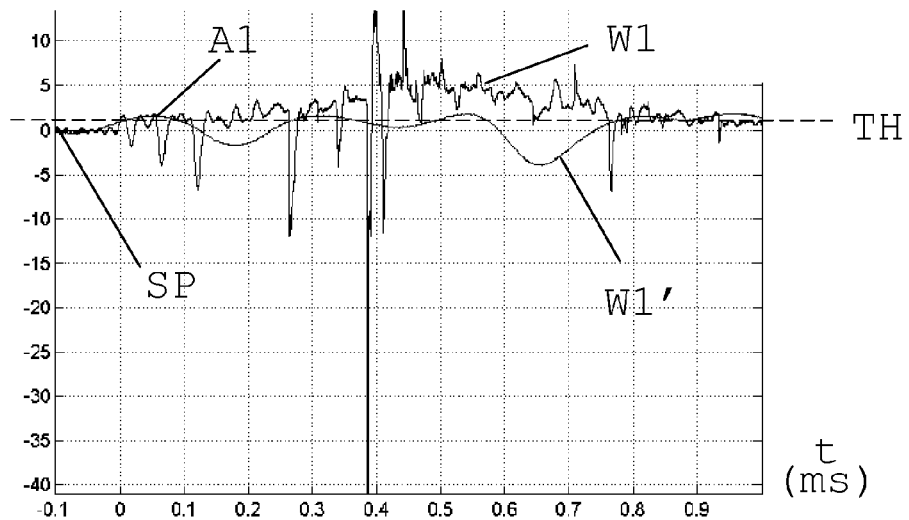

FIG. 5 shows a fault wave W1 as the derivate dV/dt of the line voltage, i.e. as a fault current in dependence of time expressed in ms together with the same wave W1' at a finer time scale and amplitude. The time scale is here furthermore related to the point in time when a fault wave is detected. The wave W1' is here magnified 10 times in time. As can be seen the fault wave has a number of spikes occurring fairly late in time. However these typically can have contributions made by reflections and other disturbances. From the magnified fault wave W1' it can also be seen that the fault wave has a number of early swings, where the amplitude A1 of the first such swing is indicated. In the figure there is also shown a threshold level TH, which is set as corresponding to the amplitude of a significant swing of the fault wave occurring at a time indicated to be zero. It can also be seen that the first swing having amplitude A1 occurs before this time of zero. The wave also has a starting point SP shows as being at −0.1 ms.

The amplitude of the significant swing of the fault wave can in one variation of the invention to be described later be used in the comparing unit 36 shown in FIGS. 2 and 3 for setting of the threshold in order to detect the occurrence of a fault wave. This threshold can be set by the threshold level setting unit 43 or the analyzing unit 42, via a setting signal TH_SET.

As can be seen in FIG. 4, the fault in the fifth curve causes a fault wave the beginning of which is hard to detect. In another variation of the invention the threshold of the comparing unit can therefore instead be set to correspond to the amplitude A1 of the first swing of a simulated fault wave. This will guarantee an early detection of the presence of a fault wave. This simulated fault can furthermore be set to be caused by an imaginary fault at a neighboring measurement point of the system, for instance at the second measurement point in relation to the first measurement point. This threshold is therefore in this variation determined according to a worst case scenario, when a fault occurs as far away as possible, i.e. at another measurement point.

The threshold can in both the described variations be adjusted in relation to amplitude for which it is set, for instance such that it is slightly lower, in order to provide a safe detection of the swing in question. This threshold level TH can furthermore be adjusted further based on field measurements of the system performance.

Figure 6:
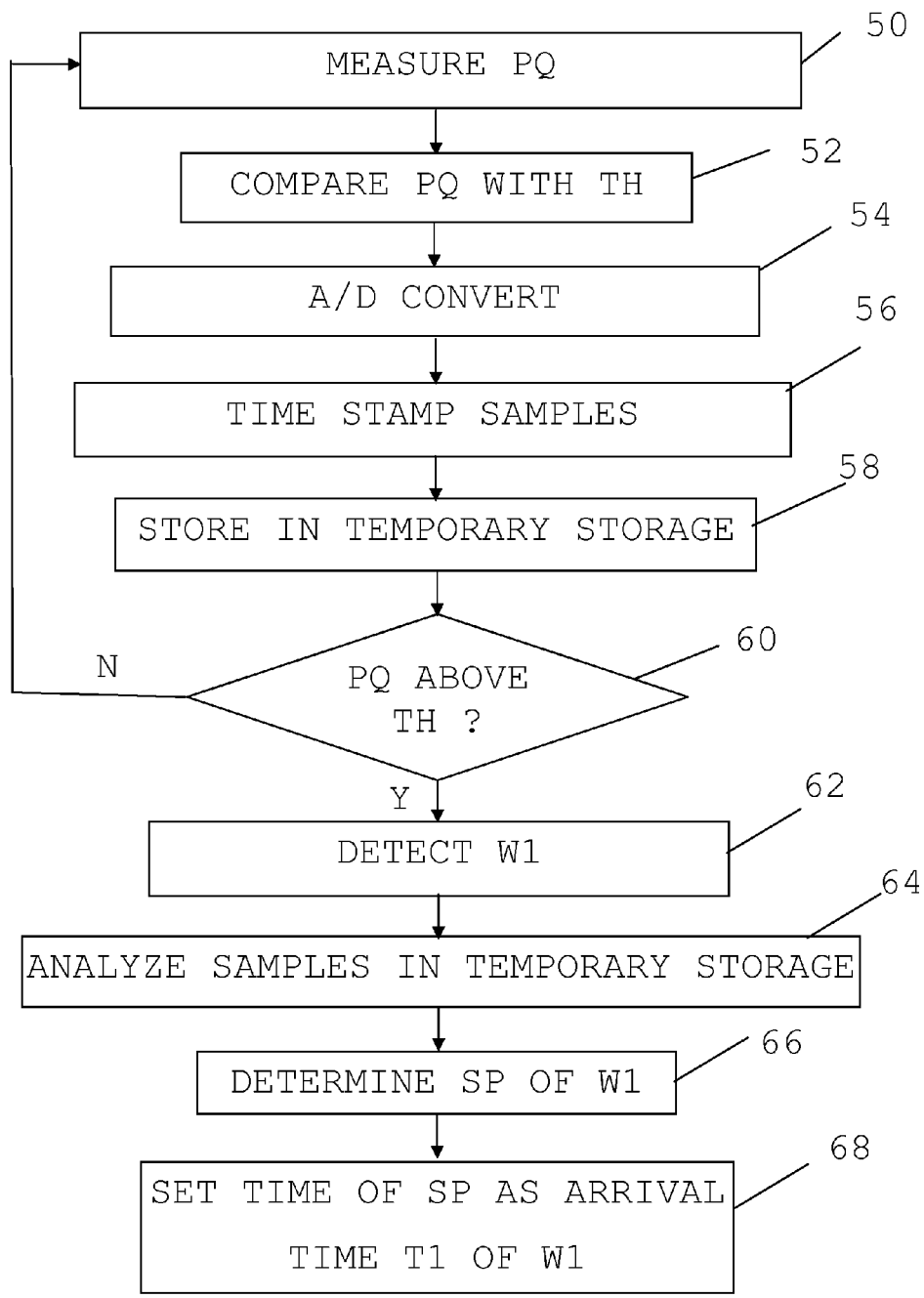

Now the functioning of the invention will be described with reference being made also to FIG. 6, which shows a flow chart outlining a number of method steps being performed in a method according to the invention.

The measurement unit 32 measures a power quantity of the power transmission system, in order to obtain a measurement quantity that is a potential fault wave. This measurement is with advantage a continuous measurement. In the first embodiment of the invention the power quantity PQ is the derivative of the line voltage, while in the second embodiment the measured power quantity PQ' is the actual line voltage. In the first embodiment the measured power quantity and measurement quantity are the same, while in the second embodiment the measurement quantity is not the same as the measured power quantity, it is the derivative of the measured power quantity and obtained through deriving, in the deriving unit 46, the measured power quantity PQ'. The derivative is of interest to use since this can provide a clear indication of the change in the power quantity, which is especially attractive if the power quantity is a DC voltage. In both cases the measurement quantity is the derivative of the line voltage.

In the first embodiment the power quantity that is also the measurement quantity is measured by the measurement unit 32, step 50, via the Rogowski coil 30 and capacitor 28. The measured quantity is then amplified by the measurement unit 32 and provided to the comparing unit 36, which compares the measurement quantity with the threshold TH, step 52, which threshold in this example has been set to correspond to the amplitude of the significant swing of the fault wave in FIG. 5. The result of the comparison is provided to the analyzing unit 42.

The amplified measurement quantity is also forwarded to the A/D converter 34, where it is A/D converted, step 54, as timed by the local clock 40. The samples created through this conversion are then forwarded from the A/D unit 34 to the temporary storage unit 38, where they get time stamped by the local clock 40, step 56, and thereafter stored in the storage unit 38, step 58. In this way the local clock determines the time relationship of the measurement quantity. In this way new measurement values are furthermore shifted into the storage unit 38 and old values are shifted out after a suitable time. The time a measurement value is stored in the storage unit may be about 2-10 ms. In this way time stamped samples of the measurement quantity may be continuously measured and continuously stored in the storage unit as long as the system is running.

As is mentioned above, the result of the comparison of the measurement quantity with the threshold TH was provided to the analyzing unit 38. If the comparison shows that the measurement quantity stays below the threshold TH, step 60, then measurements are continued to be made, compared with a threshold, time stamped and stored in the storage unit 38 in the previously described way, while the analyzing unit 42 is inactive. However, in case the measurement quantity rises above the threshold TH, step 60, the comparing unit 36 had detected the presence of a fault wave W1 at the first measurement point, step 62, and the result of the comparison supplied to the analyzing unit 42 included information about this detection. The analyzing unit 42 then analyzes at least some of the samples in the temporary storage unit 38, step 64, and thus analyzes measurements of the measurement quantity made before the presence of the fault wave at the first measurement point was detected. Based on an analysis of the shape of the wave W1, the starting point SP of the wave W1 is determined, step 66, by the analyzing unit 42. As can be seen in FIG. 5, the wave may, at least in the beginning, have swings that are fairly periodic. Knowledge of this can then be used to determine the starting point SP or beginning of the fault wave W1. The time of this starting point is then set as the time of arrival of the wave W1, step 68, i.e. as the first time value T1.

It should here be realized that even though the existence of a fault wave is determined, measurements can be continued to be made and stored in the storage unit. The analyzing unit 42 may here also analyze a suitable number of these measurements of the measurement quantity made after or following the detection of the presence of the fault wave in order to provide a more reliable determination of the time T1 of arrival of the fault wave W1 at the first measurement point P1. The analyzing unit may here perform such analysis until the starting point SP or beginning of the fault wave is determined. The analyzing unit may therefore investigate pre-trig measurements, i.e. measurements sampled before the threshold TH was exceeded, where the pre-trig interval is sufficiently long for instance a few ms long, and continue to analyze measurements after the trig for a suitable time such as a few ms, i.e. after the threshold was exceeded. In FIG. 5 it can be seen that the starting point of the wave is at −0.1 ms before the detection of the presence of the fault wave and here measurements are shown as being made up until 1 ms after the detection.

Once the time T1 of arrival has been determined, the analyzing unit 42 forwards the first time value T1 to the fault distance determining unit 27, which also receives the corresponding second time value T2 from the second apparatus 22, which may have determined the time of arrival of the fault wave at the second measurement point in the same way. The fault distance determining unit 27 can then determine the distance to the fault based on the difference between these time values and the knowledge of the speed of a fault wave in the system. The distance to the fault can then be determined with great accuracy even though the fault wave has slow varying sections.

In the description of the invention made above a threshold having a fixed value was assumed, i.e. a threshold that is not changed once it has been set. It should be realized that it is possible to modify the invention in this respect. The threshold may be adaptively adjusted in operation of the system. The threshold may therefore be adaptively set according to operating conditions of the system and more particularly of the power line. It can for instance be set based on operating condition data OC1 of the system, which data may be received by the threshold setting unit 43 or analyzing unit 42 of the first apparatus 20 from the first set of converters 14. Operating condition data OC1 may here include data about the direction of power transferred through the network and in particular the direction of power transferred past the first measurement point, converter control data such as data concerning delay angles like the magnitude of delay angles as well as data regarding the number of converters in the first set being connected for operation. If a number of converters in the first set are connected for operation in this way, then the same number of converters of the second set will also be connected for operation. This means that the threshold can be adjusted based on the number of converters on opposite sides of the first measurement point that are being operative for transmitting power past this point.

All of these measures can be used to influence the setting of the threshold. The delay angles used influence the noise levels of the power line. Large delay angles do for instance raise noise levels that the threshold may be adjusted to be larger than. The set of converters may be series connected and sometimes a reduced number of converters may be used in a set, such as for instance half on each side of the power line. In this case the threshold level may be reduced, for instance halved, because the voltage levels are reduced.

The invention has a number of advantages. It provides an improved accuracy as the time of arrival of the incoming wave can be more accurately determined than in the known schemes. Most improvement will be seen for faults in the sections of the power line that are closer to the ends, i.e. closer to the measurement points at the substations. The invention also avoids the need for special satellite synchronized clocks that can time stamp an incoming pulse. Instead more general purpose satellite synchronized clocks can be used, which do not have to be dedicated to the fault wave arrival time determination.

The invention allows many different elements for scaling the incoming wave to be used, as limitations in the measurement unit and the scaling units (such as limited bandwidth) can be largely compensated by the analyzing unit. Examples of such elements are the compensated resistive voltage measuring divider, and different types of current measurement elements. In the description made above the power quantity measured was the voltage or the derivate of the voltage. It should also be realized that it is also possible to perform the same type of measurements based on the current. As mentioned above the threshold setting unit can be provided as a separate unit or be a part of the analyzing unit.

The power line can be an overhead line. It can also be provided in an underground cable.

As is evident form the foregoing description it is not necessary with an adjustable threshold. Therefore the threshold setting unit and the corresponding functionality in the analyzing unit may be omitted. As is also clear from the description it is possible to also include the time delay determining unit in an apparatus according to the invention.

The comparison with the threshold was above described as being performed before A/D-conversion. It should be realized that it can also be performed after the A/D conversion.

The invention was above described as being used in relation to the determination of a distance to a fault. It should be realized that the invention is not limited to this. The invention can for instance be used in security related application where the determination of the arrival time of a fault wave is needed.

Consequently the present invention is only to be limited by the following claims.

The invention claimed is:

1. Method for determining the time of arrival of a fault wave (W1) caused by a fault at a measurement point (P1) of an HVDC power transmission system, comprising the steps of
   measuring a power quantity (PQ; PQ') of the system at the measurement point in order to obtain a measurement quantity that is a potential fault wave,
   storing the measurement quantity in a storage unit,
   detecting the presence of a fault wave at said measurement point through comparing the measurement quantity with a threshold (TH),
   analyzing measurements of the measurement quantity made before the presence of the fault wave was detected,
   determining the starting point (SP) of said fault wave based on said analysis concerning fairly periodic swings in the shape of the wave,
   setting the time of the starting point to be the time of arrival (T1) of the fault wave,
   determining the distance to a fault from the measurement point based on the difference between the time of arrival of said fault wave at said measurement point and the time of arrival of said fault wave at a further measurement point (P2) as well as based on knowledge of the speed of the fault wave in the system, and
   adaptively adjusting (TH_SET) the threshold based on operational condition data (OC1) of the system, wherein the operational condition data comprises data indicating the direction of power transfer past the measurement point.

2. Method according to claim 1, wherein the step of analyzing measurements comprises analyzing measurements of the measurement quantity made after the presence of the fault was detected.

3. Method according to claim 1, wherein the measurement quantity is the derivative of the power quantity being measured.

4. Method according to claim 3, further comprising the step of setting the threshold to correspond to the amplitude (A1) of the first swing of a simulated fault wave.

5. Method according to claim 4, further comprising the step of adjusting the threshold level based on field measurements of system performance.

6. Method according to claim 1, wherein there is more than one converter on each of two opposite sides of the measurement point, wherein the step of adaptively adjusting the threshold comprises adjusting the threshold based on the number of converters on each opposite side being operative for transmitting power past said measurement point.

7. Method according to claim 1, wherein the operational condition data comprises converter control data.

8. Apparatus for determining the time of arrival of a fault wave caused by a fault at a measurement point (P1) of an HVDC power transmission system, comprising:
   a measurement unit coupled to said measurement point and configured to measure a power quantity (PQ; PQ') of the system in order to obtain a measurement quantity that is a potential fault wave,
   a time keeping unit,
   a storage unit configured to store the measurement quantity,
   a comparing unit configured to compare the measurement quantity with a threshold (T1) for detecting the presence of a fault wave (W1) at said measurement point,
   an analyzing unit configured to
   analyze measurements of the measurement quantity made before the presence of the fault wave was detected,
   determine the starting point (SP) of the fault wave based on said analysis concerning fairly periodic swings in the shape of the wave, and
   set the time of the starting point to be the time (T1) of arrival of the fault wave,
   a fault distance determining unit configured to determine the distance to a fault from the measurement point based on the difference between the time (T1) of arrival of said fault wave at said measurement point and the time (T2) of arrival of said fault wave at a further measurement point (P2) as well as based on knowledge of the speed of the fault wave in the system, and a threshold setting unit configured to receive operational condition data (OC1) of the system and adaptively adjust (TH_SET) the threshold based on this operational condition data, wherein the operational condition data comprises data indicating the direction of power transfer past the measurement point.

9. Apparatus according to claim 8, wherein the analyzing unit is further configured to analyze measurements of the measurement quantity made after the presence of the fault was detected.

10. Apparatus according to claim 8, wherein the measurement quantity is the derivative of the power quantity being measured.

11. Apparatus according to claim 10, wherein the threshold is set to correspond to the amplitude (A1) of the first swing of a simulated fault wave.

12. Method according to claim 2, wherein the measurement quantity is the derivative of the power quantity being measured.

13. Method according to claim 12, further comprising the step of setting the threshold to correspond to the amplitude (A1) of the first swing of a simulated fault wave.

14. Method according to claim 13, further comprising the step of adjusting the threshold level based on field measurements of system performance.

15. Method according to claim 2, wherein there is more than one converter on each of two opposite sides of the measurement point, wherein the step of adaptively adjusting the threshold comprises adjusting the threshold based on the number of converters on each opposite side being operative for transmitting power past said measurement point.

16. Method according to claim 3, wherein there is more than one converter on each of two opposite sides of the measurement point, wherein the step of adaptively adjusting the threshold comprises adjusting the threshold based on the number of converters on each opposite side being operative for transmitting power past said measurement point.

17. Method according to claim 4, wherein there is more than one converter on each of two opposite sides of the measurement point, wherein the step of adaptively adjusting the threshold comprises adjusting the threshold based on the number of converters on each opposite side being operative for transmitting power past said measurement point.

18. Method according to claim 5, wherein there is more than one converter on each of two opposite sides of the measurement point, wherein the step of adaptively adjusting the threshold comprises adjusting the threshold based on the number of converters on each opposite side being operative for transmitting power past said measurement point.

19. Method according to claim 2, wherein the operational condition data comprises converter control data.

20. Method according to claim 3, wherein the operational condition data comprises converter control data.

* * * * *